(12) United States Patent
Ogihara et al.

(10) Patent No.: US 6,180,961 B1
(45) Date of Patent: *Jan. 30, 2001

(54) LIGHT EMITTING SEMICONDUCTOR DEVICE WITH STACKED STRUCTURE

(75) Inventors: Mitsuhiko Ogihara; Yukio Nakamura; Masumi Taninaka; Takatoku Shimizu, all of Tokyo (JP)

(73) Assignee: Oki Electric Industry, C., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/093,609

(22) Filed: Jun. 9, 1998

(30) Foreign Application Priority Data

Jun. 9, 1997 (JP) .................................................. 9-150869
Nov. 27, 1997 (JP) .................................................. 9-325890

(51) Int. Cl.$^7$ ................................................... H01L 33/00
(52) U.S. Cl. .................................. 257/94; 257/79; 257/96
(58) Field of Search ............................. 257/94, 96, 102, 257/101, 103, 13, 17, 22, 79

(56) References Cited

U.S. PATENT DOCUMENTS

| | | | |
|---|---|---|---|
| 4,942,439 | 7/1990 | Schairer | 257/94 |
| 5,189,496 | * | 2/1993 | Kuwabara | 257/94 |

FOREIGN PATENT DOCUMENTS 64-35970   2/1989  (JP) .
9-045954   2/1997  (JP) .

OTHER PUBLICATIONS

Hikari Purinta Sekkei, "Photo Printer Design", Y. Takekida, Torikeppusu KK, Oct. 31, 1985, pp. 121–126.

Hakko Daiodo, "Light–Emitting Diodes", Okuno, Sangyou Tosho KK, Jan. 20, 1994, pp. 27–31.

Kotai Hakko–soshi to sono Oyo, "Solid Light–Emitting Elements And Their Uses", Nakamura et al., Sanpo, 1976.

* cited by examiner

Primary Examiner—Minh Loan Tran
(74) Attorney, Agent, or Firm—Venable; Robert J. Frank; James R. Burdett

(57) ABSTRACT

A high-density semiconductor device and semiconductor device array exhibiting high light emission efficiency which can be mass-produced at low cost with high yield is provided. An LED array comprises a structure wherein an n-type GaAs buffer layer 102 is formed on an n-type GaAs substrate 101, on which are then stacked an n-type $Al_zGa_{1-z}$As layer 103, an n-type $Al_yGa_{1-y}$As layer 104, a semi-insulating $Al_xGa_{1-x}$As layer 105, and a semi-insulating GaAs layer 106. The energy band gaps of the $Al_zGa_{1-z}$As layer 103 and $Al_xGa_{1-x}$As layer 105 are at least larger than the energy band gap of the $Al_yGa_{1-y}$As layer 104. A pn junction is formed by selective diffusion, having a diffusion front in the semiconductor layer having the smaller energy band gap sandwiched between the semiconductor layers having the larger energy band gaps. The outermost layer forming ohmic contact is made a p-type GaAs region formed by zinc diffusion in a semi-insulating GaAs layer.

32 Claims, 15 Drawing Sheets

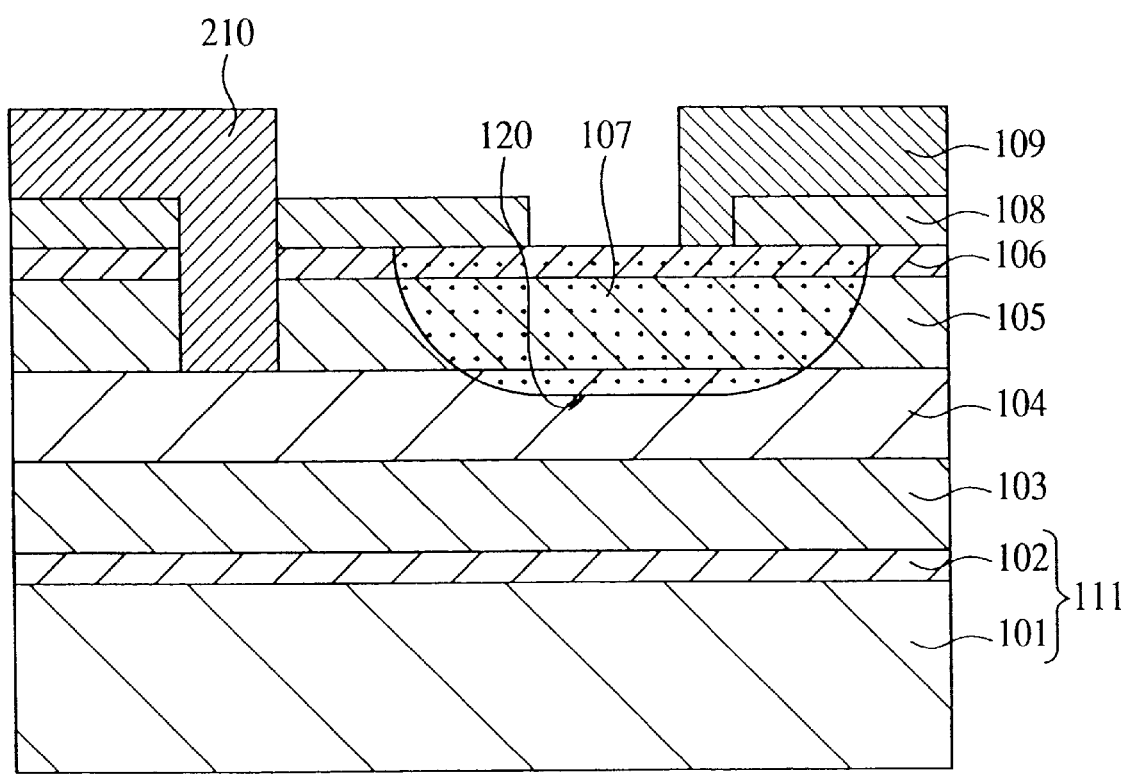

○ : electron
● : hole

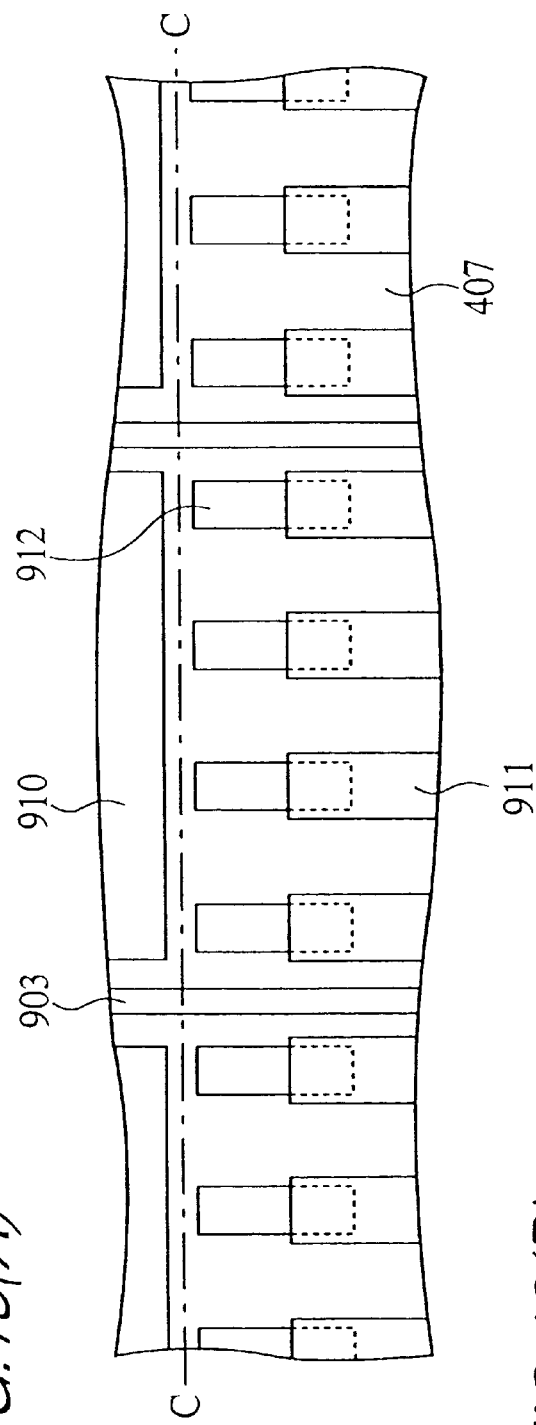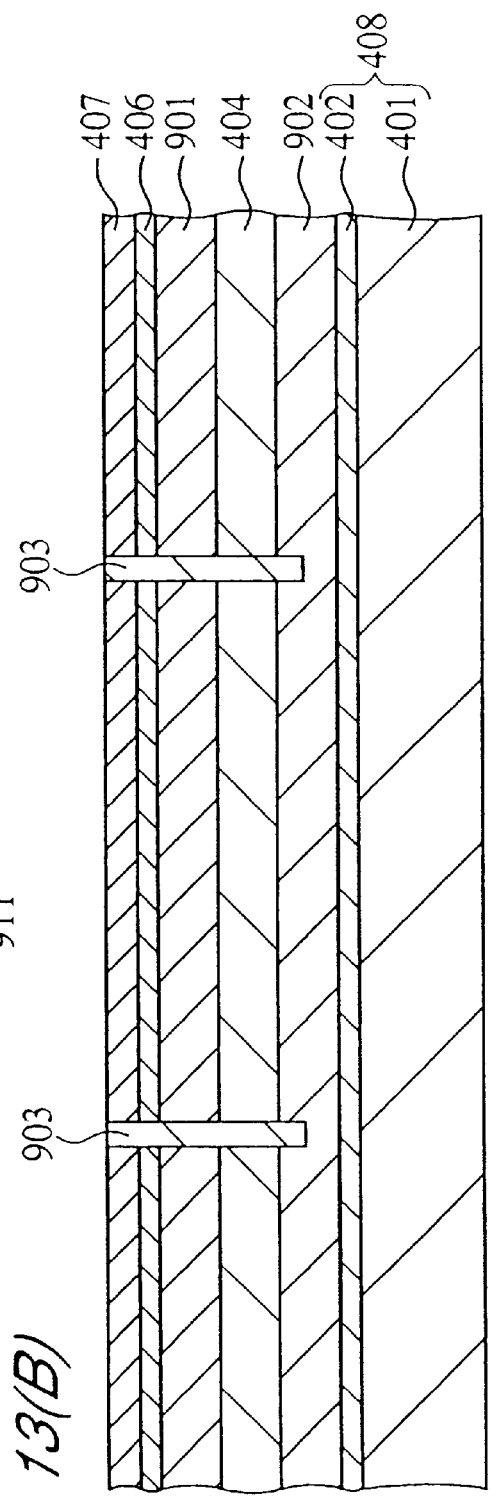
FIG. 13(A)
FIG. 13(B)

PRIOR ART

LIGHT EMITTING SEMICONDUCTOR DEVICE WITH STACKED STRUCTURE

BACKGROUND OF THE INVENTION

1. Field of the Invention

This invention concerns a light emitting semiconductor device, such as a light emitting diode device, and a light emitting semiconductor device array.

2. Description of the Related Art

Light emitting diode (LED) devices have been widely employed as display devices for some time because the light which they emit is brilliant, the drive voltage is low, and the peripheral circuitry is simple.

Conventionally, the LED arrays used in photo printers are such as are disclosed, for example, in *Hikari Purinta Sekkei (Photo Printer Design)*, pp 121–126, ed. by Y. Takekida, Torikeppusu KK, Oct. 31, 1985. Conventionally these have been fabricated by selectively diffusing zinc on a substrate made by epitaxial growth of GaAsP on a GaAs substrate (hereinafter called a GaAsP⁻ substrate).

FIG. 14 is a diagram which models conventional LED fabrication. This LED comprises an n-type GaAs substrate 11, an n-type GaAsP epitaxial layer 12 wherein Te is doped and epitaxially grown on the n-type GaAs substrate 11, a p-type GaAsP epitaxial region 13 formed by diffusing Zn, a SiN insulating film 14 which functions as a mask for Zn diffusion, an Al electrode 15, and an Au—Ge electrode 16. This LED is structured by the formation of a pn junction by diffusing zinc, which is a p-type impurity, in an n-type GaAsP substrate. Junctions having this structure are commonly called homo junctions.

LEDs structured in this way provide the advantages of requiring comparatively few fabrication steps and of being easy to fabricate. In such LEDs as these, the minority carriers injected through the junction recombine with the majority carriers and emit light. The wavelength of this emitted light corresponds to the energy band gap of the substrate semiconductor. For this reason, the light emitted is affected by large light absorption in the p-type region as it passes through, wherefore the light emission efficiency is not high, which is a problem.

In distinction to LEDs based on the homo junction, as described above, there are LEDs which use a pn junction (hereinafter called a hetero junction) formed by joining a different crystal, such as is set forth, for example, in *Hakko Daiodo (Light-Emitting Diodes)*, pp. 27–31, Okuno, Sangyou Tosho KK, Jan. 20, 1994. As will be described subsequently, the light emission efficiency of an LED can be made higher with a hetero junction than with a homo junction.

FIG. 15(A) is a diagram of the structure of an LED using the hetero structure, while FIG. 15(B) is a diagram of an example of an energy band gap therein. FIG. 15 is a diagram of an example of an LED commonly called a single hetero structure (SH structure).

The LED having the single hetero structure shown in FIG. 15(A) is structured with a p-type $Al_{0.35}Ga_{0.65}As$ layer 21 epitaxially grown on a p-type GaAs substrate 20, with an $Al_{0.65}Ga_{0.35}As$ layer 22 grown epitaxially on top of that. Reference numerals 23 and 24 show Au electrodes, respectively.

With this structure, as shown in FIG. 15(B), the positive holes injected through the junction are blocked from diffusing by the energy barrier at the hetero junction interface, whereupon the proportion that recombines increases. The wavelength of the light emitted, moreover, corresponds to the energy band gap of the $Al_{0.35}Ga_{0.65}As$ layer 21, while the n-type $Al_{0.65}Ga_{0.35}As$ layer 22 that forms a light window is larger than the energy band gap of the $Al_{0.35}Ga_{0.65}As$ layer 21, so the emitted light is not absorbed in the semiconductor region 22 that constitutes the window. Accordingly, the light emission efficiency increases.

LED arrays in which the LEDs described above are integrated are used as light sources in LED printers, for example. When an LED array is fabricated by homo junctions, pn junction arrays can be easily fabricated by selective diffusion in which the diffusion into the semiconductor is performed through the diffusion mask openings. The fabrication of LED arrays by this selective diffusion is easy, and it is possible to fabricate a super-high-density 1200 dpi LED array.

With a conventional hetero structured LED such as this, a semiconductor layer having an energy band gap larger than the energy of the light forms a window, so there is no light absorption, and the efficiency with which the light is drawn to the outside is enhanced. On the other hand, with an LED array using LEDs of this structure, it is necessary to provide device separation between the devices. For that purpose, the elements are separated, for example, by mesa etching. This places limitations on the integration density of the LED array.

Thus, in the related art, there is no technology for fabricating LED arrays that exhibit high light emission efficiency and are capable of super-high-density integration.

An object of the present invention is to provide both a light emitting semiconductor device and a light emitting semiconductor device array that exhibit high light emission efficiency and wherewith high densities can be achieved.

Another object of the present invention is to provide both a light emitting semiconductor device and a light emitting semiconductor device array that can be mass-produced at low cost and high yield.

SUMMARY OF THE INVENTION

A first aspect of the present invention is a light emitting semiconductor device having the following construction. First, a laminated or stacked structure is formed that comprises at least, on a substrate, a semiconductor layer having an energy band gap, and, beneath that semiconductor layer, a first conductivity type semiconductor layer having a relatively smaller energy band gap than that of aforesaid semiconductor layer. A pn junction face is formed selectively in the first conductivity type semiconductor layer. In addition, the laminated or stacked structure described above, including the first conductivity type semiconductor layer, contains at least one layer that is a semi-insulating layer of an undoped semiconductor layer.

As based on this light emitting semiconductor device structure, this semiconductor laminated or stacked structure exhibits enhanced light emission efficiency, for the following reasons. First, it is a hetero-epitaxial structure. Second, injected electrons can be contained or confined between the pn junction face provide din the first conductivity type semiconductor layer and the lamination interface between that semiconductor layer and the semiconductor layer on top of it, whereupon the injection electron density rises, so that the recombination probability increases. Third, the wavelength of the emitted light is determined by the energy band gap of the first conductivity type semiconductor layer, but the energy band gap of the semiconductor layer above, which constitutes a light emission window, is large, so the emitted light is not absorbed.

As based on this light emitting semiconductor device structure, moreover, the laminated or stacked structure described above can be formed so as to be thin, and the pn junction can also be formed so that it is locally shallow, so that no wide device separation space is required for forming selectively the pn junction regions in the first conductivity type semiconductor layers, making it possible to raise the light emitting semiconductor device density, but wide device separation space is required for mesa-etched grooves or the like between the light emitting semiconductor devices.

A second aspect of the present invention is a light emitting semiconductor device having the following construction. In the first place, a laminated or stacked structure is provided wherein semiconductor layers having energy band gaps are positioned on and beneath a first conductivity type semiconductor layer having a relatively smaller energy band gap than those of aforesaid semiconductor layers. A second conducting impurity diffusion region is formed that extends from the upper surface of the outermost semiconductor layer provided above in the laminated or stacked structure to within the first conductivity type semiconductor layer. In this outermost semiconductor layer, the impurity diffusion region is a semiconductor material wherein an electrode and ohmic contact can be implemented. Also, this outermost semiconductor layer is made either a semi-insulating or undoped semiconductor layer, so that no pn junction will be formed inside the outermost semiconductor layer.

As based on this light emitting semiconductor device structure, the laminated or stacked structure exhibits a hetero-epitaxial structure, and injected electrons are contained or confined between a pn junction face formed by the first conductivity type semiconductor layer and the second conductivity type diffusion region and the lamination interface between the first conductivity type semiconductor layer and the semiconductor layer formed thereon. On the other hand, injected holes are contained or confined between this pn junction face and the lamination interface between the first conductivity type semiconductor layer and the semiconductor layer formed beneath it. Light emission efficiency rises due to two facts, namely, that the recombination probability of the injected minority carriers rises, and that the emitted light is not absorbed because, while the wavelength of the emitted light is determined by the energy band gap of the first conductivity type semiconductor layer, the energy band gap of the upper semiconductor layer that forms the light emission window is larger than the energy band gap of the first conductivity type semiconductor layer that forms the light emission region.

Also, as based on this light emitting semiconductor device structure, the laminated or stacked structure described above can be formed so as to be thin, and the pn junction can be formed so as to be locally shallow. In addition thereto, according to the above structure, there is no need for wide device isolation or separation space between the light emitting semiconductor devices, which is quite different from a mesa-etched groove structure requiring wide isolation regions. Consequently, according to the above semiconductor device structure, light emitting semiconductor device density can be made high.

Also, as based on this light emitting semiconductor device structure, the pn junction is formed by impurity diffusion, and the structure is such that an electrode and ohmic contact can be effected in the impurity diffusion region of the outermost semiconductor layer. Therefore, no special structure is necessary in each device for device separation, which alone makes the structure simpler, and, accordingly, well suited to mass production at low cost and high yield.

According to a third aspect of the present invention, a light emitting semiconductor device has the following structure. That is, the device comprises an underlayer and a laminated or stacked body formed by lamination on the upper surface of the underlayer. This laminated or stacked body is constituted by laminating a first semiconductor layer having an energy band gap of Eg1, a first conductivity type second semiconductor layer having an energy band gap of Eg2, and a third semiconductor layer having an energy band gap of Eg3, in that order. On or above this laminated body is provided a fourth semiconductor layer that is either semi-insulating or undoped. A second conductivity type diffusion region is formed as a partial region or regions, extending from the upper surface of the fourth semiconductor layer into the second semiconductor layer. A first electrode and a second electrode are provided for injecting carriers into this diffusion region and second semiconductor layer. These first, second, third, and fourth semiconductor layers, respectively, are formed from compound semiconductors. Furthermore, the design is made such that, between Eg1, Eg2, and Eg3, the relationships Eg1>Eg2, and Eg3>Eg2 are sustained. Also, the diffusion front of the diffusion region described above forms a pn junction face in the second semiconductor layer.

As based on this light emitting semiconductor device structure, light emission efficiency is enhanced for the following reasons. First, the laminated or stacked body (laminated or stacked structure) described above is formed as a hetero-epitaxial structure. Second, injected electrons are contained or confined between the pn junction face provided in the first conductivity type second semiconductor layer and the lamination interface between that second semiconductor layer and the third semiconductor layer on it, whereupon the density of the injected electrons rises, while injected positive holes are contained or confined between the pn junction face and the lamination interface between the first conductivity type second semiconductor layer and the first semiconductor layer beneath it, whereupon the positive hole density rises, wherefore the recombination probability of the injected minority carriers is increased. Third, the wavelength of the emitted light is determined by the band gap of the first conductivity type second semiconductor layer, but the band gap of the third semiconductor layer on it that forms the light emission window is greater, so the emitted light is not absorbed.

As based on the construction of this light emitting semiconductor device, moreover, the laminated or stacked body described above can be formed so as to be thin, and the pn junction can be formed so as to be locally shallow, whereupon no wide device isolation or separation space is required between the light emitting semiconductor devices, which is different from a mesa-etched groove structure requiring wide isolation regions between the light emitting semiconductor devices. Therefore, according to the above-mentioned device structure of the present invention, higher light emitting semiconductor device density can be achieved.

As based on the structure of this light emitting semiconductor device, moreover, the diffusion front of the diffusion region forms a pn junction face within the second semiconductor layer, and the structure is such as to allow an electrode and ohmic contact to be effected in the diffusion region of the fourth semiconductor layer, so no special structure is needed in each device for device separation, making the structure that much simpler. Accordingly, the construction is well suited to mass production at low cost and high yield.

According to a preferable embodiment of the above-mentioned light emitting semiconductor device, the energy band gap Eg1 may be equal to that Eg2.

According to a fourth aspect of the present invention, respective light emitting semiconductor device arrays are provided wherein the light emitting semiconductor devices described in the foregoing are formed and arrayed.

With a light emitting semiconductor device array structured in this way, by making the semiconductor layer below the second semiconductor layer, or the substrate forming the semiconductor laminated or stacked structure either semi-insulating, undoped, or a second conductivity type, it is possible to fabricate semiconductor arrays exhibiting high light emission efficiency which can be matrix-driven.

BRIEF DESCRIPTION OF THE DRAWINGS

The foregoing and other objects, features and advantages of the present invention will be better understood from the following description taken in connection with accompanying drawings, in which:

FIG. 4 is a view showing a cross-sectional cutaway in another modification of the light emitting semiconductor device shown in FIG. 2;

FIG. 13 is an explanatory diagram for a light emitting semiconductor device array employing the light emitting semiconductor device and device separation regions of FIG. 11, FIG. 13(A) being a simplified partial plan of this array, and FIG. 13(B) being a diagram of a cutaway in a cross-section from the C—C plane in a light emitting semiconductor device configuring the light emitting semiconductor device array of FIG. 13(A);

DESCRIPTION OF THE PREFERRED EMBODIMENTS

Preferred embodiments of the present invention are now described, with reference to the drawings. It should be noted, however, that the drawings are intended merely to represent schematically the shapes, sizes, and positional relationships of the various constitutional components to such a degree as will enable the constitution of the present invention to be understood, and nothing more. Furthermore, the embodiments described below are simply preferred embodiments, and the present invention is not to be understood to be limited to or by these embodiments. In these embodiments, moreover, constitutional examples in which LEDs are used as the light emitting semiconductor device are described.

(First Embodiment)

Figure 1:
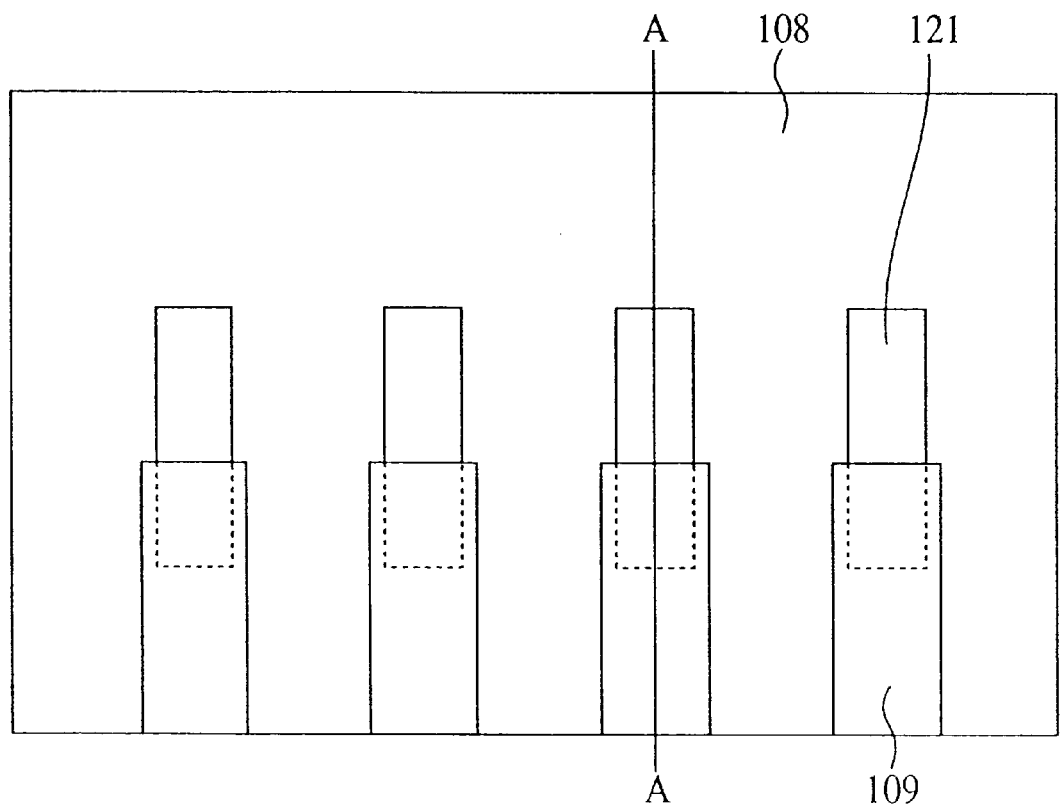
FIG. 1 is a partial plan view schematically showing the basic structure of a first embodiment of a light emitting semiconductor device array wherein the present invention is applied.
Figure 2:
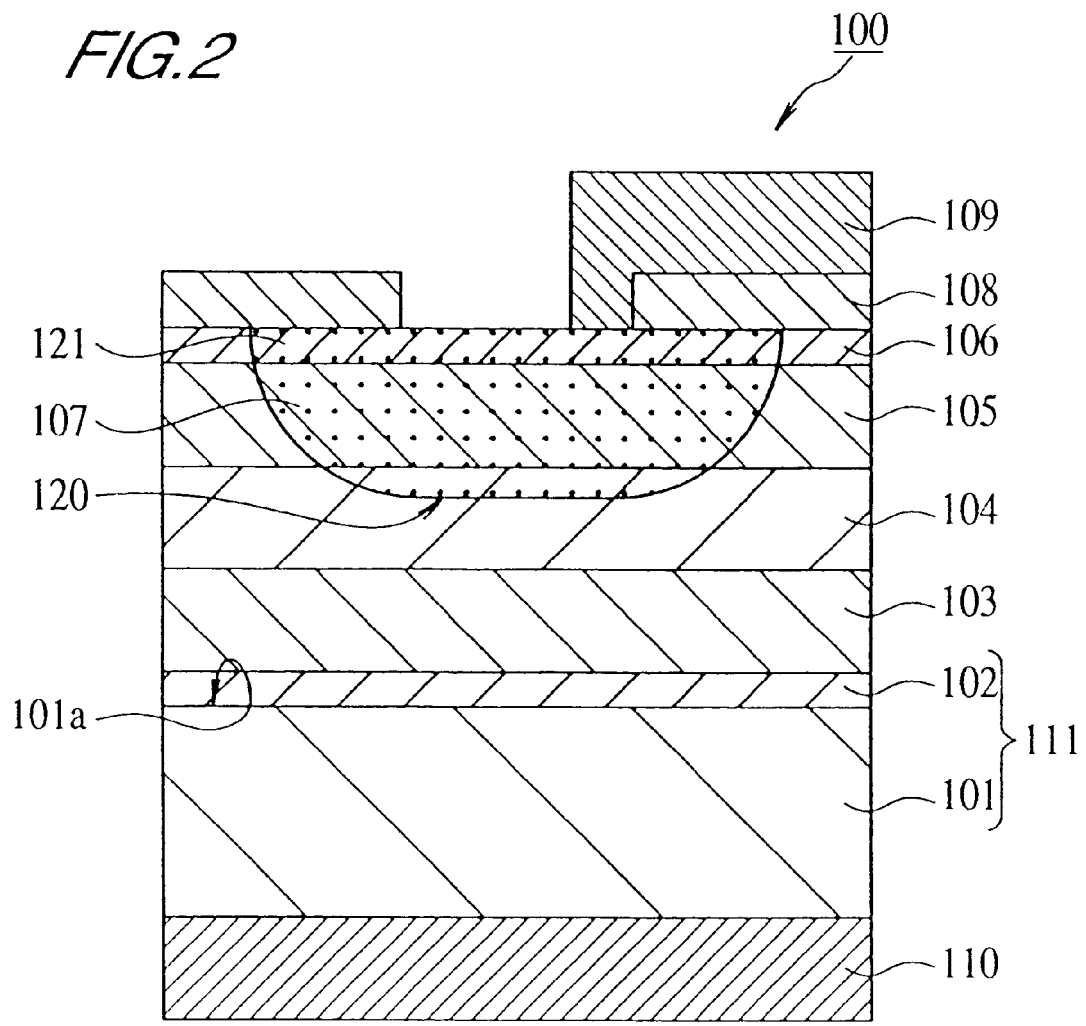
FIG. 2 is a view showing a cutaway in a cross-section in the A—A plane of a light emitting semiconductor device that configures the light emitting semiconductor device array shown in FIG. 1.

FIG. 1 is a diagram representing the structure of an LED array to which the first embodiment of the present invention pertains. FIG. 2 is a diagram of a cutaway in a cross-section taken from the A—A plane in FIG. 1, being a diagram wherein one device in an LED array wherein multiple LEDs are aligned is focused on, and representing the cross-sectional structure thereof as a model. In the following embodiments, the first conductivity type is described as an n-type, and the second conductivity type is described as a p-type.

In FIGS. 1 and 2, an LED 100 comprises an n-type GaAs substrate 101, an n-type GaAs buffer layer 102 formed on the n-type GaAs substrate 101, an n-type first semiconductor layer 103 such as an $Al_zGa_{1-z}As$ layer epitaxially grown on the GaAs buffer layer 102, an n-type second semiconductor layer 104 such as an $Al_yGa_{1-y}As$ layer, a semi-insulating third semiconductor layer 105 such as an $Al_xGa_{1-x}As$ layer, a semi-insulating or undoped fourth semiconductor layer 106 such as a GaAs layer, a Zn diffusion region 107 wherein zinc (Zn) is selectively diffused and locally formed, an inter-layer insulating film 108 comprising an SiN film that constitutes a diffusion prevention mask film for zinc diffusion, a p-side electrode 109, and an n-side electrode 110. As is shown in FIG. 2, the zinc diffusion region extends from the surface of the GaAs layer 106, through the $Al_xGa_{1-x}As$ layer 105, to the $Al_yGa_{1-y}As$ layer 104. Preferably, moreover, there is present a pn junction face (diffusion front) 120 roughly parallel to the main surface of the substrate 101, i.e. the upper surface 101a, inside the $Al_yGa_{1-y}As$ layer 104.

In the LED 100 of this constructional example, an n-type GaAs buffer layer 102 is formed on the n-type GaAs substrate 101, forming an underlayer 111. The structure is such that, on this buffer layer 102, an n-type $Al_zGa_{1-z}As$ layer 103, n-type $Al_yGa_{1-y}As$ layer 104, semi-insulating $Al_xGa_{1-x}As$ layer 105, and semi-insulating or undoped GaAs layer 106 are laminated or stacked. The Al ratios of composition for x, y, and z in the compound semiconductor laminated structure or laminated body satisfy the relationships $1 \geq x > y \geq 0$ and $1 \geq z \geq y \geq 0$.

Accordingly, layer 104 may be GaAs, and layers 103 and 105 may be AlAs layers. Furthermore, when the energy band gaps of the $Al_zGa_{1-z}As$ layer 103 and $Al_xGa_{1-x}As$ layer 105 are made Eg1 and Eg3, respectively, and the energy band gap of the $Al_yGa_{1-y}As$ layer 104 is made Eg2, we have $Eg1 \geq Eg2$, and $Eg3 > Eg2$.

It is desirable that the size of the energy band gap difference be only sufficient to achieve the effect of containing or confining the injected carriers (electrons and positive holes). In this constructional example, this energy band gap difference is made approximately 0.3 eV or higher. If we have x=z=0.4, and y=0.15, for example, the energy band gap difference is approximately 0.3 eV. In the laminated structure there is a selectively formed zinc diffusion region 107. The diffusion front in the depth direction in the zinc diffusion region 107 is a pn junction face, and this pn junction face is inside the n-type $Al_yGa_{1-y}As$ layer 104. Preferably, this pn junction face should be made roughly parallel with the lamination faces in the laminated structure, but is not by any means limited thereto. The diffusion will also cross over in the lateral direction, and be formed in directions that are not parallel to the lamination faces, so such formation will also take place in layer 105 and layer 106, but the pn junction is only formed in the $Al_yGa_{1-y}As$ layer 104.

The uppermost GaAs layer 106, moreover, is a layer that covers the $Al_xGa_{1-x}As$ layer in order to form an electrode and ohmic contact.

When the Al composition x is large, Al will be oxidized, making it difficult to form ohmic contact with the $Al_xGa_{1-x}As$ layer. Ohmic contact can be formed with GaAs, so it is possible to continually form ohmic contact by covering with GaAs.

GaAs, on the other hand, has a smaller energy band gap than does $Al_xGa_{1-x}As$, wherefore, in cases where a pn junction is formed in the GaAs layer, almost all of the current passing through the device will pass through the pn junction in the GaAs layer. That being so, in such cases, the emitted light wavelength will be a wavelength that corresponds to the energy band gap of GaAs, and the device will not function.

For the reasons set forth above, providing the GaAs layer 106 elicits two effects, namely that, irrespective of the material making up the layer 105, ohmic contact can be continually formed, and that no pn junction is formed in the GaAs layer.

In other words, the semi-insulating or undoped GaAs layer 106 is provided so as to achieve the effects noted above simultaneously.

The inter-layer insulating film 108 is provided on the GaAs layer 106. This inter-layer insulating layer 108 is provided as a mask for selective diffusion when forming the zinc diffusion region 107 described earlier. This inter-layer insulating film is also called a diffusion prevention mask. An SiN film, for example, may be used for this diffusion prevention mask 108. If the diffusion can be controlled well, some other insulating film such as $Al_2O_3$ or AlN may be used. In the LED construction of this example, the semiconductor layer below the insulating layer is a semi-insulating or undoped GaAs layer and, therefore, a high-resistance layer. Therefore, even if there are some pinholes or flaws in the insulating layer, it is still possible to adequately insulate the n-side semiconductor layers from the p-side electrode 109 that extends over the insulating layer.

On the inter-layer insulating film 108 there is the p-side electrode 109 that is in ohmic contact with the surface of the zinc diffusion region 107. The p-side electrode 109 may be formed of an aluminum-based material, for example. The n-side electrode 110 is formed as a common electrode on the back surface of the GaAs substrate 101. A gold alloy, for example, may be used for this n-side electrode.

Figure 5A:
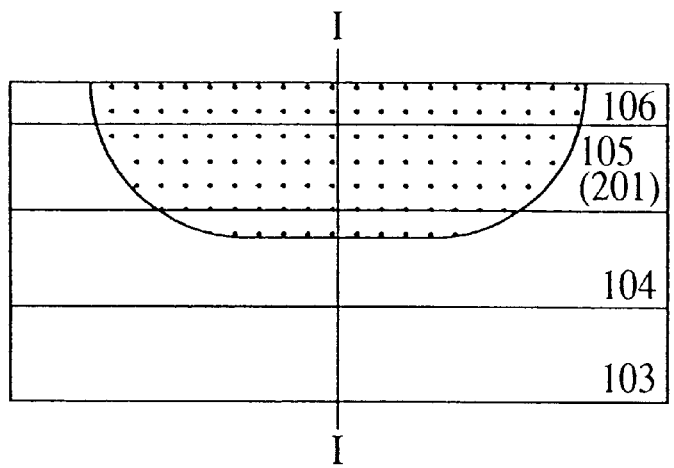
FIG. 5(A) is a model partial cross-sectional view of the laminar structure of the light emitting semiconductor devices shown in FIGS. 2, 3, and 4.
Figure 5B:
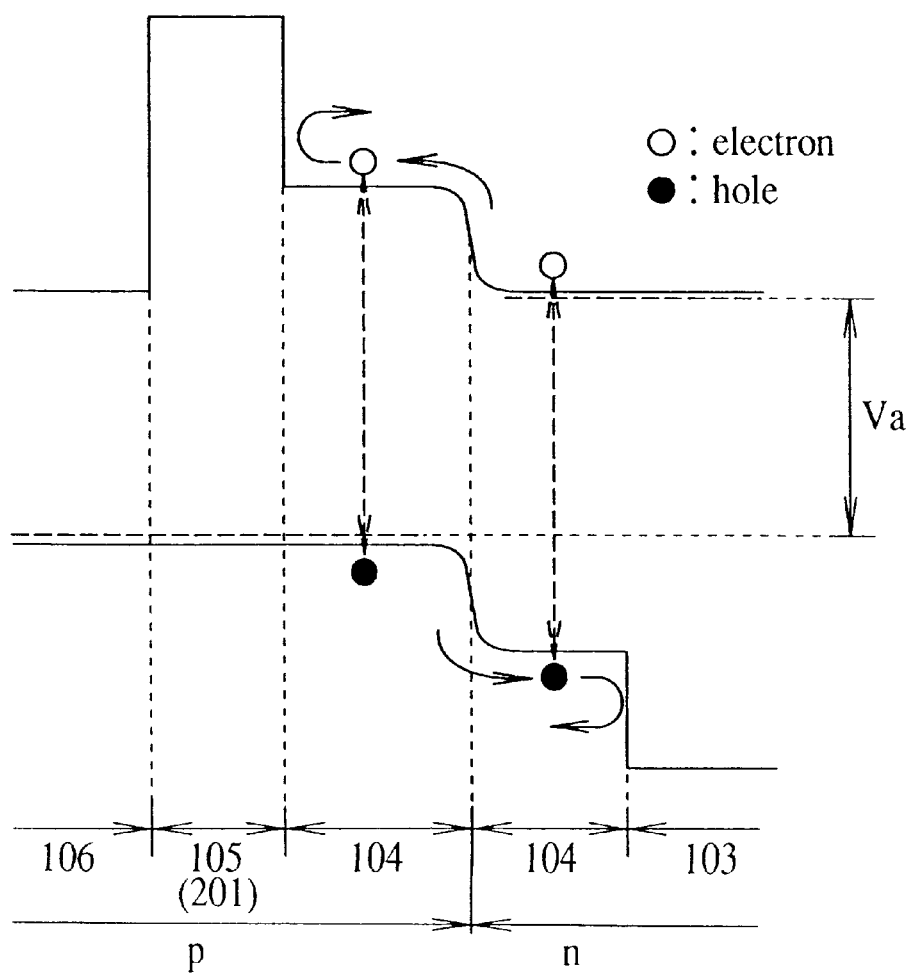
FIG. 5(B) is an energy band structure diagram in a region in the I—I plane of FIG. 5(A)

The operation of the LED 100 constituted as described in the foregoing will now be described with reference to FIGS. 2, 5(A), and 5(B). FIG. 5(A) is a model diagram of the laminated or stacked structure portion of the LED device shown in FIG. 2, while FIG. 5(B) is a band structure diagram in a region in the I—I plane of FIG. 5(A). Va is the voltage applied to the pn junction. In the example structure of the LED array 100 described in the foregoing, layers other than the first conductivity type are formed on the second semiconductor layer 104, so the pn junction is only in the $Al_yGa_{1-y}As$ layer 104. That being so, when a current is made to flow in the forward direction between the p-side and n-side electrodes 109 and 110, light is emitted with an energy that corresponds to the aluminum ratio of composition or aluminum mixture ratio y. Electrons injected into the p-type diffusion region 107 cannot diffuse into the $Al_xGa_{1-x}As$ layer 105 because of the barrier (Eg3>Eg2) formed at the interface between the $Al_xGa_{1-x}As$ layer 105 and the $Al_yGa_{1-y}As$ layer 104, and so are contained or confined within the narrow region between the pn junction face 120 and the lamination interface. Accordingly, the density of the injected electrons will rise, causing their recombination probability to increase, and thus enhancing the light emission efficiency. A barrier (Eg1>Eg2) will also exist at the interface between the $Al_zGa_{1-z}As$ layer 103 and the $Al_yGa_{1-y}As$ layer 104, so the positive holes injected into the n layer 104 will also be contained or confined within a narrow region. This being so, these contained or confined positive holes will contribute to the enhancement of light emission efficiency.

The energy band gap of the $Al_xGa_{1-x}As$ layer 105 is larger than the energy of the emitted light $E_\lambda$ being calculated as $E_\lambda = hc/\lambda$, where h is a Plank's constant and $\lambda$ is a wavelength of the emitted light and c is a light velocity, so the emitted light is not absorbed by the $Al_xGa_{1-x}As$ layer 105. If the thickness of the GaAs layer 106 is made thin, moreover, at a thickness of 500 Å, for example, the amount of absorption will be very small, and hence the efficiency with which light is brought to the outside will be enhanced. This GaAs layer 106 need only have a thickness that will at least completely cover the upper surface of the layer 105 below it; it may be the thickness of the GaAs crystal laminated or stacked portion, for example.

The zinc diffusion region 107 in the semi-insulating or undoped GaAs layer 106 functions as an ohmic contact layer. When the aluminum ratio of composition in the AlGaAs is larger than about 0.2, it is difficult to achieve ohmic contact due to aluminum oxidation. However, due to the presence of the p-type GaAs region 121 formed by zinc diffusion (that is, the region of zinc diffusion within the GaAs layer 106), continual ohmic contact can be formed irrespective of the aluminum mixture ratio in the $Al_xGa_{1-x}As$ layer 105.

The semi-insulating or undoped GaAs layer 106 is a semi-insulating semiconductor layer or a high-resistance semiconductor layer having a resistivity $\geq$ approximately $10^7$ Ω·cm. Therefore, even if zinc is diffused, all that happens is that a p-type conducting layer is formed by the zinc diffusion in the semi-insulating or undoped GaAs layer 106, and no pn junction is formed. If the semi-insulating or undoped GaAs layer 106 should happen to be an n-type layer, a pn junction would be formed by zinc diffusion in the layer 106, a current would be injected into the surface GaAs layer, and light emission efficiency would decline. Similarly, since the $Al_xGa_{1-x}As$ layer 105 is made semi-insulating, only a conducting layer is formed when zinc is diffused and so there is no contribution made to light emission. Accordingly, it is not necessary to go to the length of providing a structure wherewith current will not flow in the pn junction that is formed by selective zinc diffusion in layers other than the $Al_yAs_{1-y}As$ layer having a smaller band gap than the $Al_yGa_{1-y}As$ layer (which, in this embodiment example, wherein the outermost layer is not semi-insulating but rather is an n-type GaAs layer, would be the n-type GaAs layer), thus simplifying the device structure, and, hence, also simplifying the fabrication process.

Also, it is possible to contain or confine injected electrons by the barrier at the interface between the $Al_xGa_{1-x}As$ layer 105 and the $Al_yGa_{1-y}As$ layer 104, between that interface and the pn junction face (diffusion front) 120, so they can be made to recombine efficiently even when the distance from the interface between the $Al_xGa_{1-x}As$ layer and the $Al_yGa_{1-y}As$ layer and the diffusion front 120 in the depth dimension is made smaller than the mean free path of the electrons. Accordingly, it becomes possible to reduce the thickness of the epitaxial layers.

By making the layer thicknesses thin in the semiconductor laminated or stacked structure, and making the selective diffusion depth shallow, it is easy to form device arrays wherein the devices are mutually insulated and thus electrically independent, thus also making it possible to fabricate super-high-density LED arrays such as the 1200 DPI (pitch interval=21.2 microns).

As described in the foregoing, the LED array to which the first embodiment pertains has an n-type GaAs buffer layer 102 formed on an n-type GaAs substrate, and comprises, laminated thereupon or thereabove, an n-type $Al_zGa_{1-z}As$ layer 103, n-type $Al_yGa_{1-y}As$ layer 104, semi-insulating $Al_xGa_{1-x}As$ layer 105, and semi-insulating or undoped GaAs layer 106. Moreover, the energy band gaps Eg1 and Eg3 in the $Al_zGa_{1-z}As$ layer 103 and $Al_xGa_{1-x}As$ layer 105 are made larger than the energy band gap Eg2 in the $Al_yGa_{1-y}As$ layer 104, and a pn junction is formed by selective diffusion having the diffusion front 120 in the depth dimension in the semiconductor layer 104 sandwiched between the semiconductor layers 103 and 105 having relatively larger energy band gaps than that of the semiconductor layers 104. Furthermore, the outermost layer that forms ohmic contact is made a p-type GaAs region 107 formed by zinc diffusion in the semi-insulating or undoped GaAs layer 106. With an LED structure like this, the device structure is simple, and it is possible to implement super-high-density LED arrays that exhibit high light emission efficiency.

Figure 3:
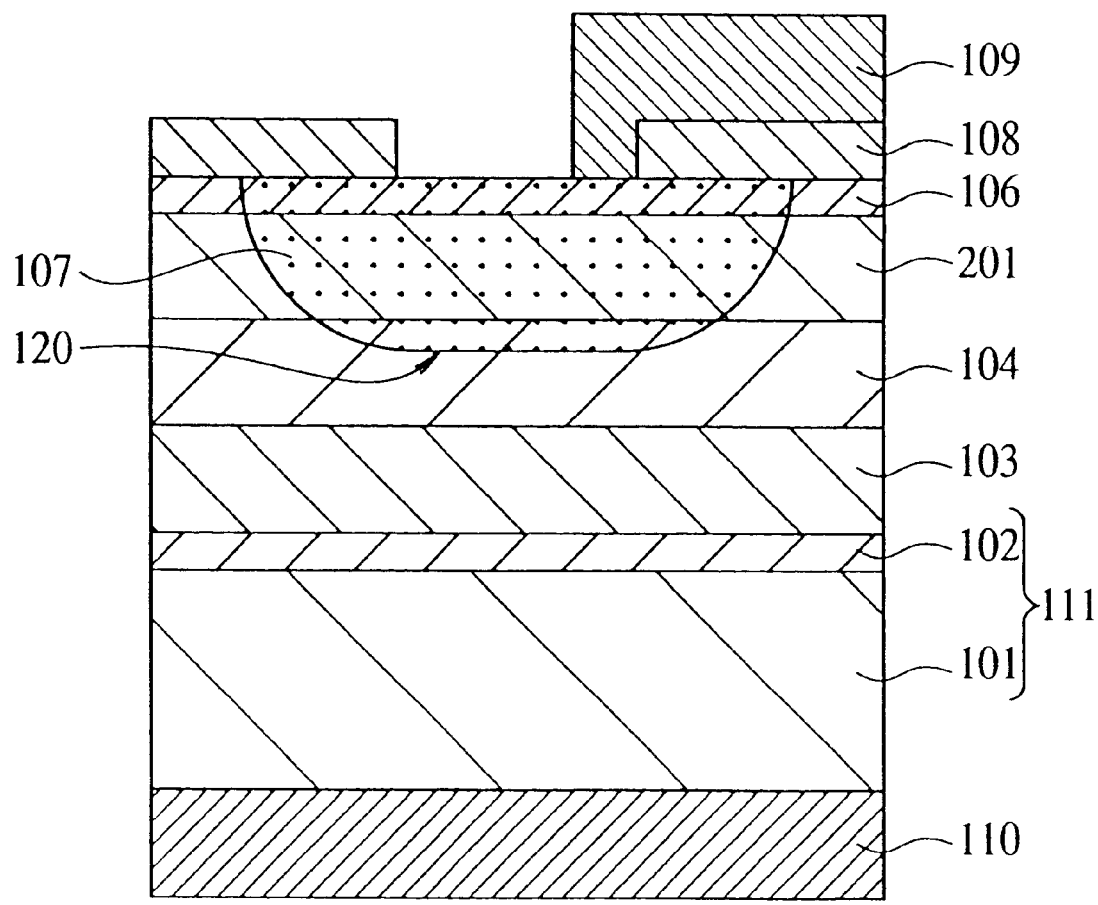
FIG. 3 is a view showing a cross-sectional cutaway in a modification of the light emitting semiconductor device shown in FIG. 2.

FIG. 3 is a cross-sectional view of an LED structure in a case wherein the semi-insulating $Al_xGa_{1-x}As$ layer 105 has been replaced by an n-type $Al_xGa_{1-x}As$ layer 201 as the third semiconductor layer. The band structure of this LED is the same as the LED shown in FIG. 2, so it is represented in FIG. 5(A) and 5(B). The n-type $Al_xGa_{1-x}As$ layer 201 has a larger energy band gap than that of the $Al_yGa_{1-y}As$ layer 104, so electrons primarily pass through the pn junction formed in the $Al_yGa_{1-y}As$ layer 104 and are injected into the zinc diffusion region 107. For this reason, the $Al_xGa_{1-x}As$ layer 201 does not contribute to light emission, and the light emission wavelength is determined by the energy band gap of the $Al_yGa_{1-y}As$ layer 104.

FIG. 4 is a cross-sectional view of an LED structure wherein the n-side electrode is formed on the upper surface of the LED device rather than on the back surface of the substrate. The band structure of this LED structure is the same as that of the LED shown in FIGS. 2 and 3, so it is represented in FIG. 5(A) and 5(B). As is shown in FIG. 4, it is also possible to form an n-side electrode 210 on the upper surface of the LED so that it makes ohmic contact with the n-type $Al_yGa_{1-y}As$ layer 104. In this example structure, the n-side electrode 210 is made so that it extends from the upper side of the inter-layer insulating film 108, through the film 108, the semi-insulating or undoped GaAs layer 106, and the semi-insulating $Al_xGa_{1-x}As$ layer 105, to the upper surface of the n-type $Al_yGa_{1-y}As$ layer 104. It is also permissible to use an n-type Si substrate instead of the n-type GaAs substrate 101.

(Second Embodiment)

Figure 6:
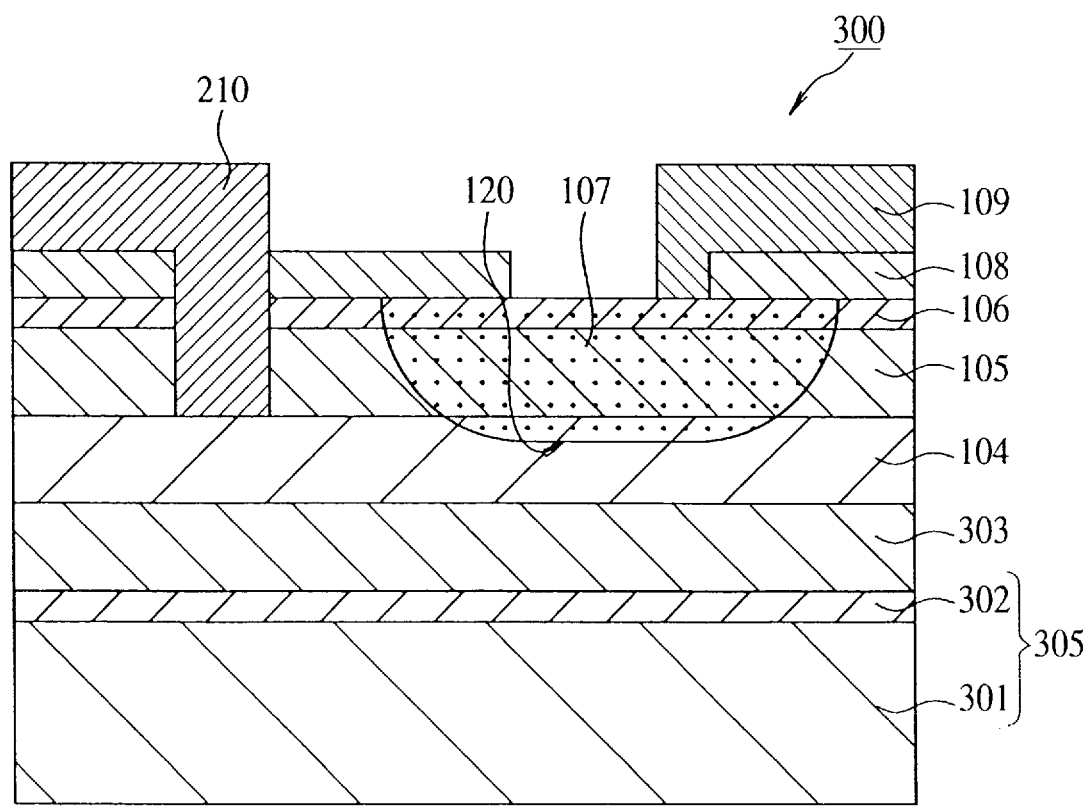
FIG. 6 is a view schematically showing a cross-sectional cutaway of the basic structure of a second embodiment of a light emitting semiconductor device wherein the present invention is applied.
Figure 7A:
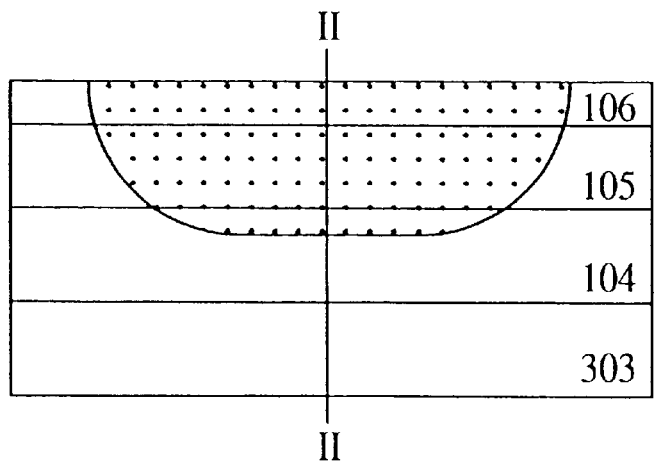
FIG. 7(A) is a model partial cross-sectional view of the laminated or stacked structure of the light emitting semiconductor device shown in FIG. 6.
Figure 7B:
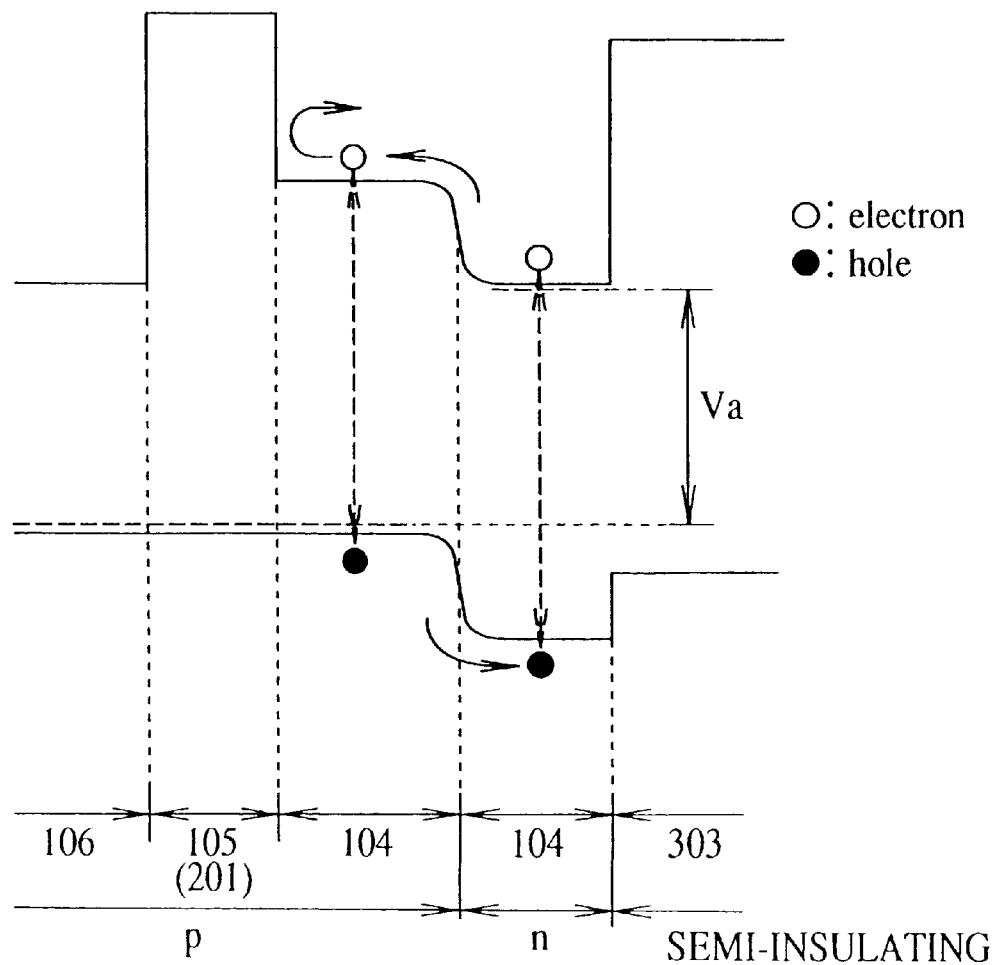
FIG. 7(B) is an energy band structure diagram in a region in the II—II plane of FIG. 7(A)

FIG. 6 is a diagram that models a structure for one device in an LED array to which the second embodiment of the present invention pertains. In describing the LED structure in this embodiment, the same reference numerals are used to designate constitutional parts that are the same as in FIGS. 1 through 4. FIG. 7(A) is a partial model diagram of the laminated or stacked structure of the LED in FIG. 6, while FIG. 7(B) is an energy band structure diagram for a region in the II—II plane of FIG. 7(A).

In the example structure illustrated in FIG. 6, an LED 300 comprises a semi-insulating or undoped GaAs substrate 301, semi-insulating or undoped GaAs buffer layer 302 formed on the semi-insulating or undoped GaAs substrate 301, semi-insulating or undoped $Al_zGa_{1-z}As$ layer 303 grown epitaxially on the semi-insulating or undoped buffer layer 302, n-type $Al_yGa_{1-y}As$ layer 104, semi-insulating $Al_xGa_{1-x}As$ layer 105, semi-insulating or undoped GaAs layer 106, zinc diffusion region 107, inter-layer insulating film 108, p-side electrode 109, and n-side electrode 210. The inter-layer insulating film 108 is an SiN insulating film, for example, that constitutes masking material for zinc diffusion. Also, an underlayer 305 is formed by a substrate 301 and buffer layer 302.

The LED 300 is structured with the semi-insulating or undoped GaAs buffer layer 302 formed on the semi-insulating or undoped GaAs substrate 301, on which are sequentially laminated or stacked the semi-insulating or undoped $Al_zGa_{1-z}As$ layer 303, n-type $Al_yGa_{1-y}As$ layer 104, semi-insulating $Al_xGa_{1-x}As$ layer 105, and semi-insulating or undoped GaAs layer 106. The Al mixture ratios x, y, and z in the laminated or stacked structure satisfy the relationships $1 \geq x > y \geq 0$ and $1 \geq z \geq y \geq 0$. The energy band gaps Eg1 and Eg3 of the $Al_zGa_{1-z}As$ layer 303 and the $Al_xGa_{1-x}As$ layer 105 are larger than the energy band gap Eg2 of the $Al_yGa_{1-y}As$ layer 104.

It is preferable that the energy band gap difference be only large enough to elicit the effect of containing or confining the injected carriers, i.e. approximately 0.3 eV or greater. If x=z=0.4, and y=0.15, for example, then the energy band gap difference will be approximately 0.3 eV. In the laminated structure there is a selectively formed zinc diffusion region 107.

The pn junction face 120 that is roughly parallel to the diffusion front in the depth dimension of the zinc diffusion region 107, that is, to the lamination faces in the laminated structure, is in the n-type $Al_yGa_{1-y}As$ layer 104. Junctions are also formed in the lateral dimension that not parallel to the lamination faces, and so are formed in both layer 105 and layer 106, but the pn junction 120 is only formed in the $Al_yGa_{1-y}As$ layer 104.

As already described, there is a diffusion prevention mask 108 on the GaAs layer 106. This diffusion prevention mask 108 also functions as an inter-layer insulating film. An SiN film, for example, may be used for the diffusion prevention mask 108. If diffusion can be well controlled, other insulating films such as $Al_2O_3$ or AlN may be used.

In this example LED structure, the semiconductor layer below the insulating film is a semi-insulating or undoped GaAs layer. Therefore, even if there are some pinholes or other flaws in the insulating layer, it is still possible to adequately insulate the n-side semiconductor layers from the p-side electrode 109 that extends over the insulating layer.

On or above the insulating film 108 there is the p-side electrode 109 that maintains ohmic contact with the surface of the Zn diffusion region 107. The p-side electrode 109 forms an ohmic contact with the Zn diffusion region surface within the semi-insulating or undoped GaAs layer. The p-side electrode 109 may be formed of an aluminum-based material, for example.

With this embodiment, as with the first embodiment described earlier, an n-type $Al_xGa_{1-x}As$ layer can be used instead of the semi-insulating $Al_xGa_{1-x}As$ layer 105.

The n-side electrode 210 is formed as a common electrode in a portion of the surface region of the n-type $Al_yGa_{1-y}As$ layer 104. A gold alloy, for example, may be used for this n-side electrode 210. The n-side electrode 210 can be made either so as to make contact with the surface of the n-type $Al_xGa_{1-x}As$ layer 105 via a throughhole formed by etching the semi-insulating or undoped GaAs layer 106 that is the outermost layer of the laminated or stacked body formed on or above the underlayer (GaAs substrate), or so as to make contact with the surface of the n-type $Al_yGa_{1-y}As$ layer 104 via throughholes formed by etching and removing portions of both the semi-insulating or undoped GaAs layer 106 and the n-type $Al_xGa_{1-x}As$ layer 105.

With the LED device having the structure described in the foregoing, it is also possible to obtain the same benefits, in terms of light emission efficiency, as was noted in conjunction with the first embodiment described earlier. More specifically, injected electrons are contained or confined in layer 104 by the barrier between layers 104 and 105, whereupon these electrons enhance light emission efficiency (FIG. 7(A) and 7(B)).

In the second embodiment, in particular, the GaAs substrate and GaAs buffer layer of the first embodiment are made semi-insulating, and the $Al_zGa_{1-z}As$ layer that serves as the first semiconductor layer is made either semi-insulating, undoped, or n-type, whereby a super-high-density light emitting device array exhibiting high light emission efficiency can be achieved with which matrix drive is possible.

Now, the LED devices to which the embodiments described in the foregoing pertain may also be arrayed to form an LED array with intervening device separation regions.

Figure 8:
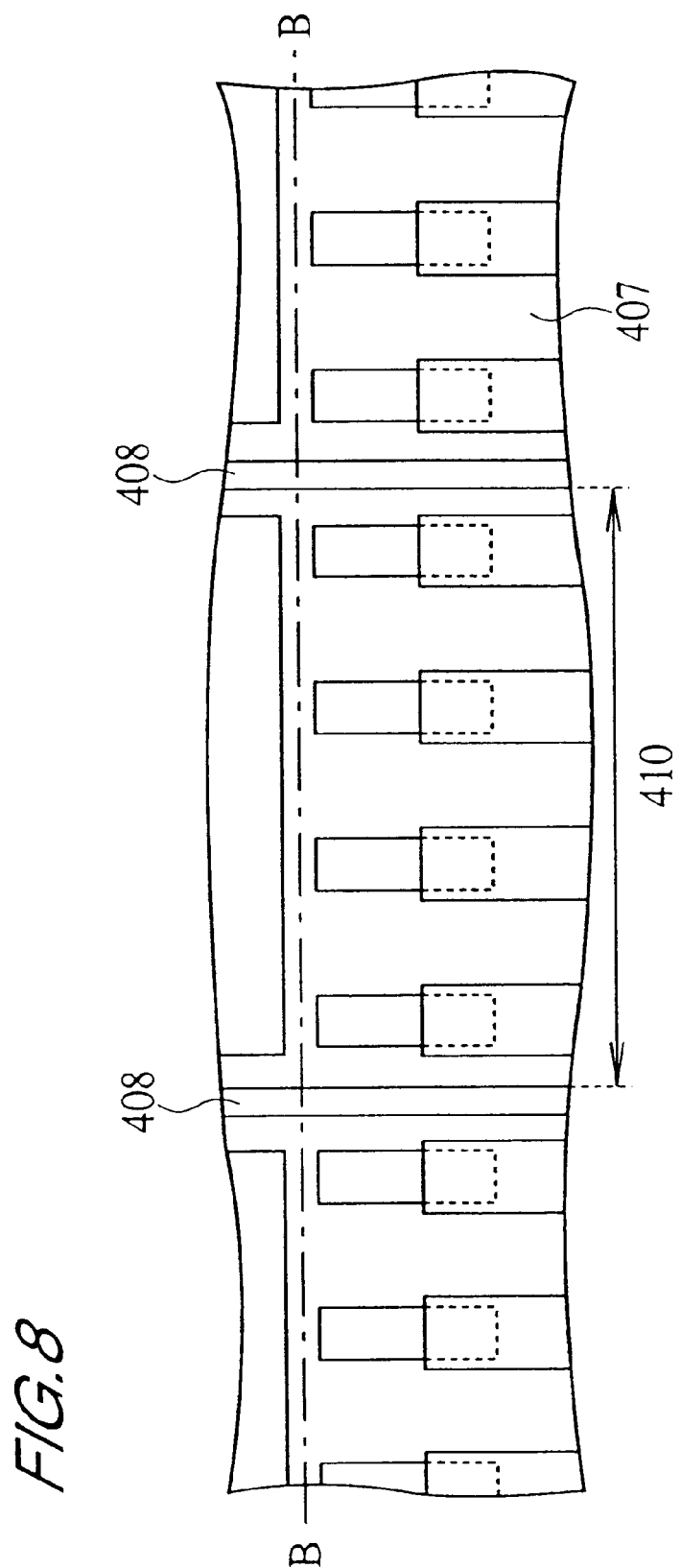
FIG. 8 is a partial plan view schematically showing a light emitting semiconductor device array wherein device separation regions are formed.
Figure 9:
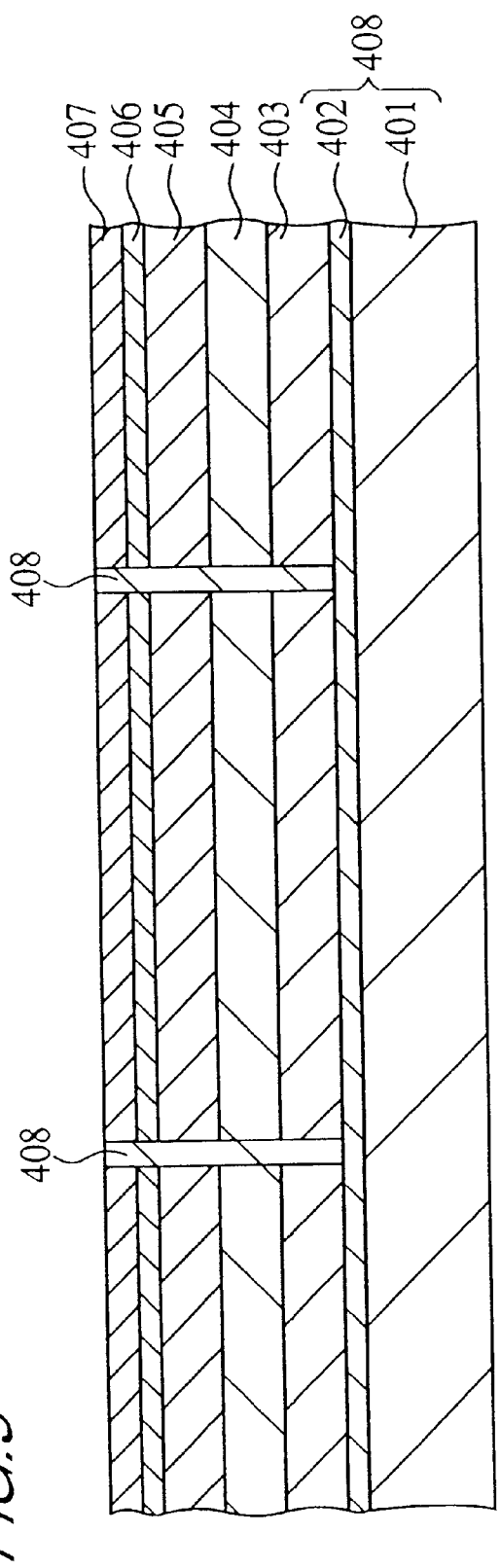
FIG. 9 is a view showing a cutaway of a cross-section taken from the B—B plane in a light emitting semiconductor device configuring the light emitting semiconductor device array shown in FIG. 8.

FIG. 8 is a diagram of an LED array structure wherein device separation regions are formed. FIG. 9 is a cross-sectional diagram in the B—B plane in FIG. 8. In these diagrams, constitutional components identical with those shown in FIG. 1 through 4 and in FIG. 6 are designated by the same reference numerals.

In the constructional example shown in FIGS. 8 and 9, on a semi-insulating or undoped GaAs substrate 401 are sequentially provided, by film deposition, a semi-insulating or undoped GaAs buffer layer 402, a first semiconductor layer that is a semi-insulating or undoped or n-type $Al_zGa_{1-z}As$ layer 403, a second semiconductor layer that is an n-type $Al_yGa_{1-y}As$ layer 404, a third semiconductor layer that is a semi-insulating or n-type $Al_xGa_{1-x}As$ layer 405, a fourth semiconductor layer that is a semi-insulating or undoped GaAs layer 406, and an inter-layer insulating film 407. The device isolation or separation regions 408 need only separate the n-type regions, and may, for example, be formed for each unit block 410 as shown in FIG. 8 which is inclusive of a plurality of LEDs having common n-side electrodes. These separation regions 408 extend from the inter-layer insulating film 407 at least to the semi-insulating or undoped GaAs buffer layer 402. In this constructional example, moreover, an underlayer 408 is formed by the substrate 401 and the buffer layer 402. Furthermore, the device separation regions 408 may be formed as etched grooves by mesa etching, or, alternatively, they may be fabricated by some method such as forming p-type impurity regions by diffusion or ion implantation.

It is also possible to fabricate a light emitting device array with which matrix drive is possible by, unlike the constructional example shown in FIG. 8, providing device separation regions 408 that extend to the $Al_zGa_{1-z}As$ layer 403, the GaAs buffer layer 402, and the GaAs substrate 401, and dividing the n-type $Al_yGa_{1-y}As$ layer 404 into blocks containing multiple pn junctions. However, these device separation regions 408 need only be provided such that the unit blocks are mutually separated electrically. That being so, it is sufficient to provide the device separation regions so that they at least extend form the semi-insulation or undoped GaAs layer 406 at the surface, across the n-type $Al_yGa_{1-y}As$ layer 404, and to the semi-insulating or undoped GaAs buffer layer 402.

If ohmic contact is made with the n-side electrode at the n-type $Al_yGa_{1-y}As$ layer, then the $Al_xGa_{1-x}As$ layer can be made a semi-insulating layer also. It is also possible to use a high-resistance Si substrate instead of the semi-insulating or undoped GaAs substrate 101.

An example wherein an LED array formed with device insulation or separation regions is matrix-driven is now described.

Figure 10:
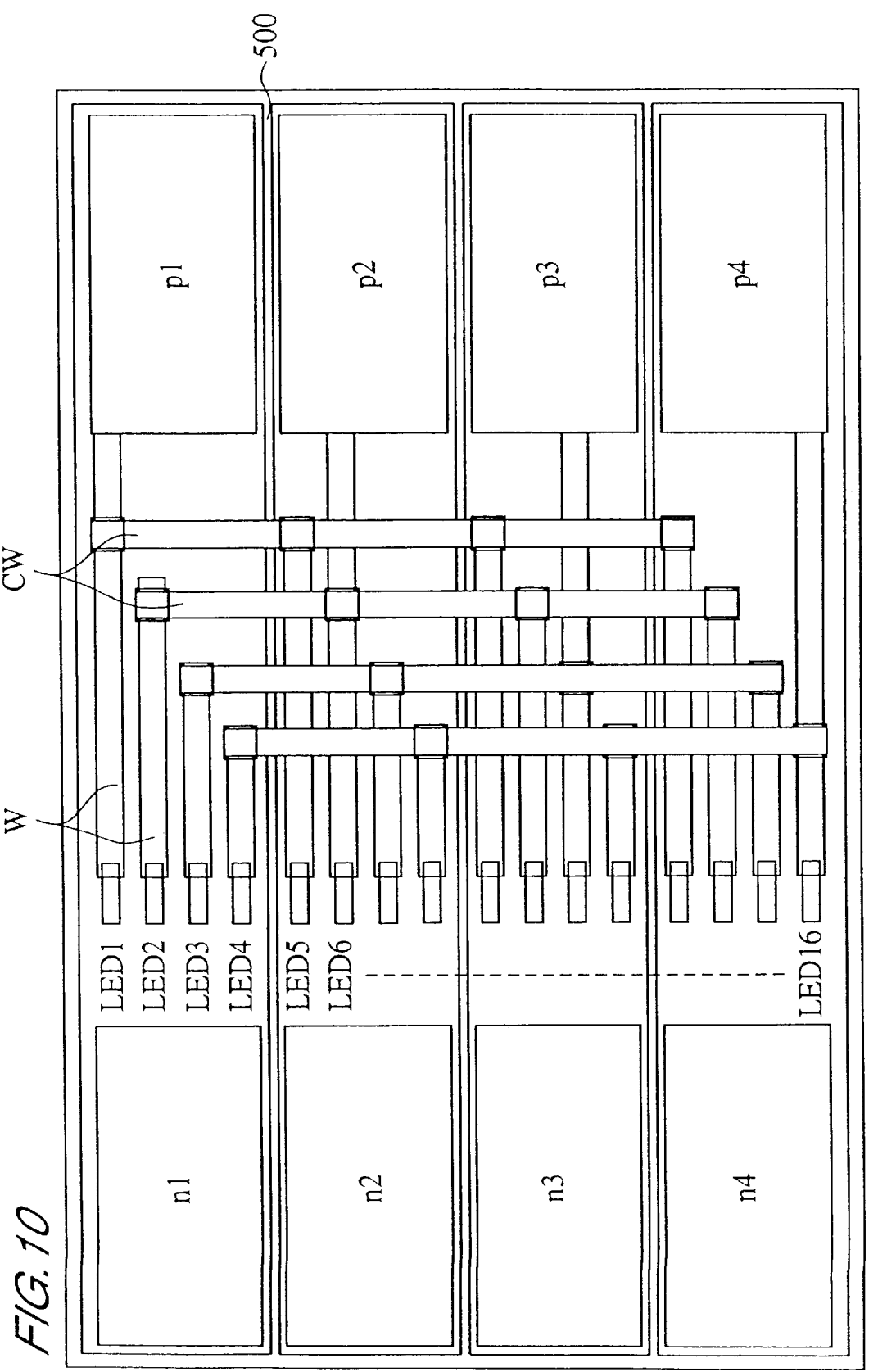
FIG. 10 is a schematic plan view for describing matrix drive in an LED array wherein device separation regions are formed.

FIG. 10 is a simplified plan view of one example of an LED array that can be matrix-driven. In the structure represented in this example, four LEDs are provided in each of four unit blocks. The n-side electrodes are designated n1, n2, n3, and n4, while the p-side electrodes are designated p1, p2, p3, and p4. Discrete conductive patterns (individual conductive patterns inside each unit block is denoted by a W, while discrete conductive patterns and common conductive patterns between unit blocks are denoted by a CW. Device separation regions between unit blocks are designated by 500. In this arrangement, the n-side electrodes are mutually insulated from each other by the device separation regions. Accordingly, when LED 1 is lighted, for example, voltage is applied across the electrodes p1 and n1 so that p1 goes to a positive potential. Similarly, when LED 2 is lighted, voltage is applied across the electrodes p2 and n1 so that p2 goes positive. Thus, to light the LEDs 3, 4, 5, . . . , 16, voltage is applied across the electrode pairs p3 and n1, p4 and n1, p1 and n2, . . . , p4 and n4. Hence the LED array in this construction can be matrix-driven by applying voltages in this manner.

In other words, an LED array capable of being matrix driven can be fabricated by having multiple LEDs exist in n-side regions separated by device separation regions, implementing a structure wherein LEDs in the same rank within each block are connected by common condutive patterns CW.

(Third Embodiment)

Figure 11:
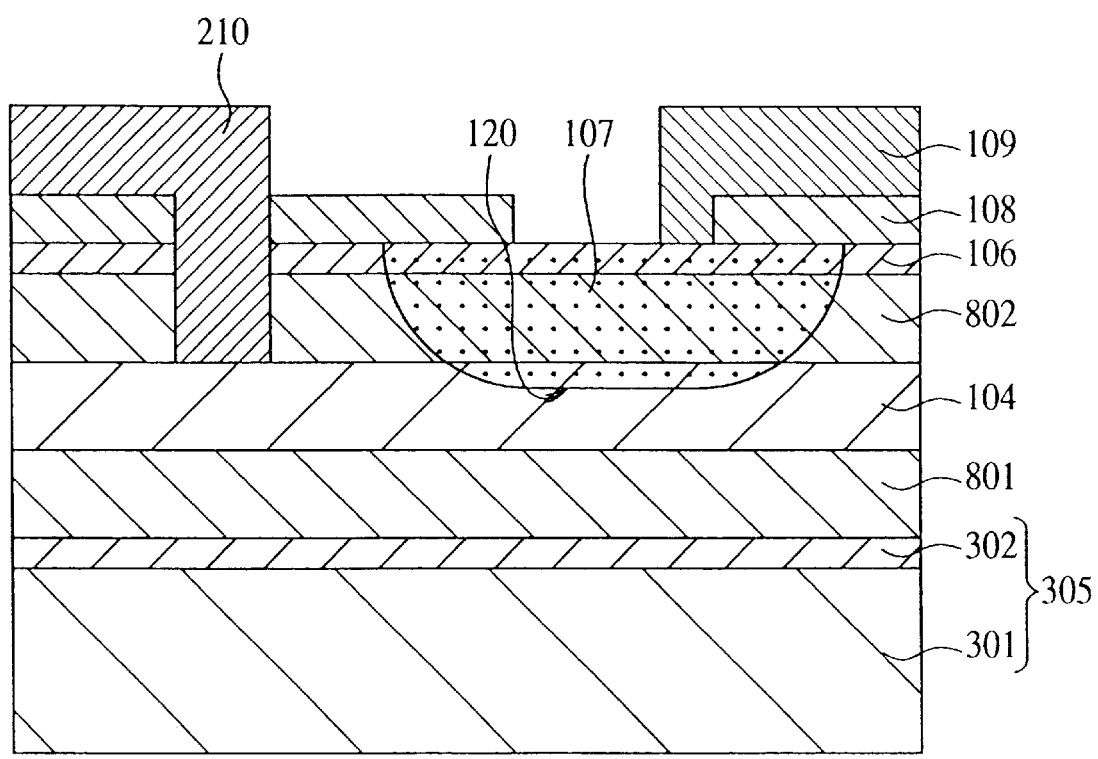
FIG. 11 is a view showing a cross-sectional cutaway in the basic structure of a third embodiment of a light emitting semiconductor device in which the present invention is applied.
Figure 12A:
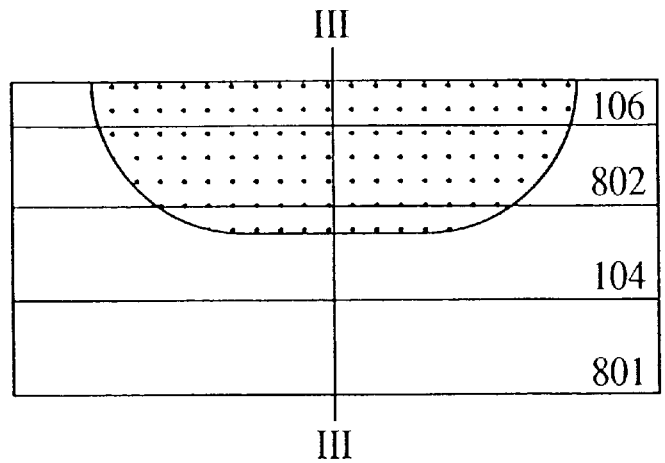
FIG. 12(A) is a partial model cross-sectional view of the laminated or stacked structure in the light emitting semiconductor device shown in FIG. 11.

FIG. 11 is a diagram of the basic structure of a semiconductor device (LED) to which the third embodiment pertains. In describing this embodiment, constructional elements that are the same as those noted in FIG. 6 are given the same reference characters. FIG. 12(A) is a diagram that models the laminated or stacked structure of the LED shown in FIG. 10, while FIG. 12(B) is an energy band structure diagram for a region in the III—III plane in FIG. 12(A).

This embodiment has a laminated or stacked structure wherein are sequentially provided, on a semi-insulating or undoped GaAs substrate 301, a semi-insulating or undoped GaAs buffer layer 302, a first semiconductor layer that is a p-type $Al_zGa_{1-z}As$ layer 801, a second semiconductor layer that is an n-type $Al_yGa_{1-y}As$ layer 104, a third semiconductor layer that is an n-type $Al_xGa_{1-x}As$ layer 802, and a fourth semiconductor layer that is a semi-insulating or undoped GaAs layer 106. A zinc diffusion region 107 is also provided, formed by the selective diffusion of zinc in the depth dimension from the surface of the laminated structure. The diffusion front 120 of this diffusion region 107 in the depth dimension exists in the $Al_yGa_{1-y}As$ layer 104. This diffusion front 120 should, preferably, be more or less parallel to the substrate faces. In this case, the underlayer 305 comprises the substrate 301 and buffer layer 302.

LED devices of this constructional example may be used to fabricate an LED array having device separation regions as shown in FIGS. 8 and 9.

Figure 12B:
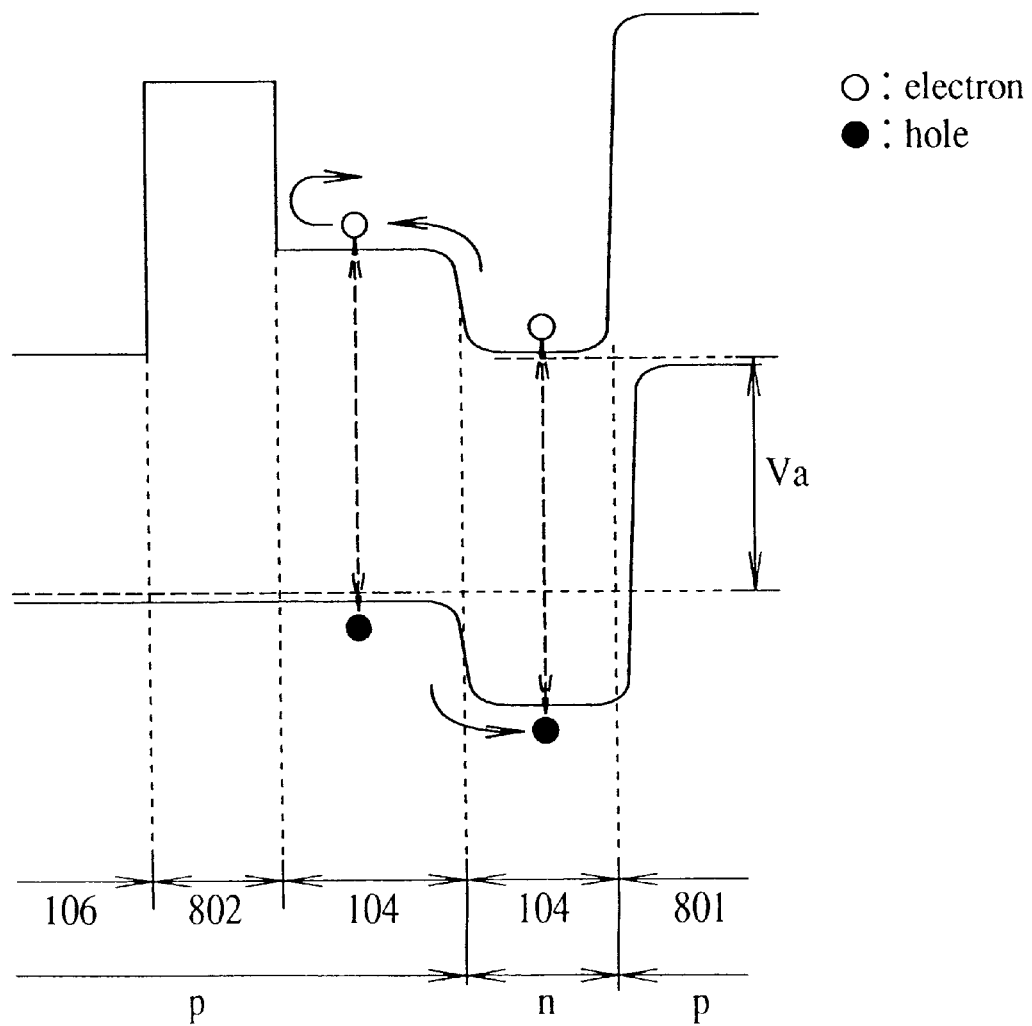
FIG. 12(B) is an energy band structure diagram in a region in the III—III plane in FIG. 12(A)
Figure 14:
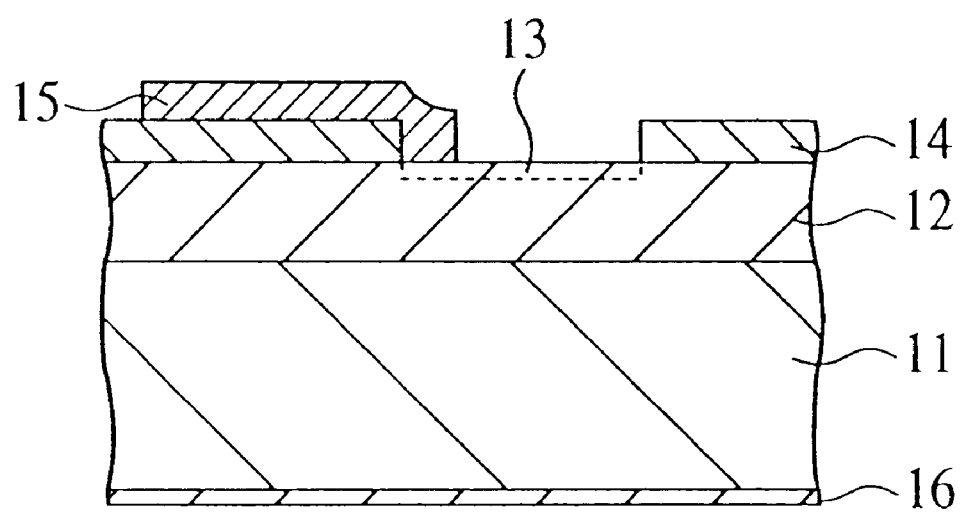
FIG. 14 is a cross-sectional view provided for describing an LED structure in a conventional light emitting semiconductor device.
Figure 15A:
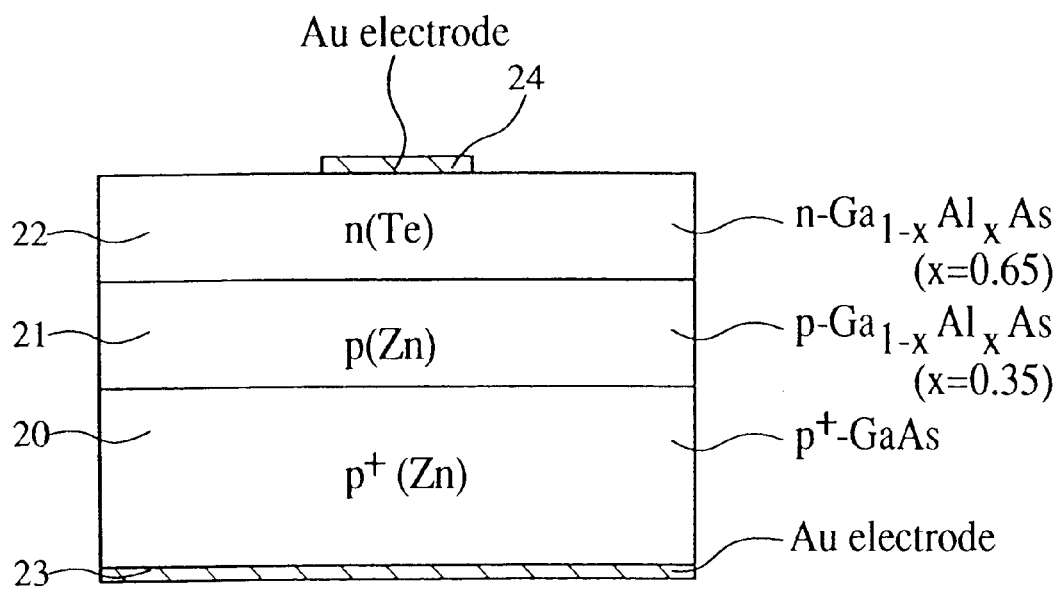
FIG. 15 is a diagram provided for describing the basic structure of an LED which is a conventional light emitting semiconductor device, FIG. 15(A) being a cross-sectional view, and FIG. 15(B) being a diagram representing an energy band gap structure provided for describing the operation of the structure shown in FIG. 15(A).
Figure 15B:
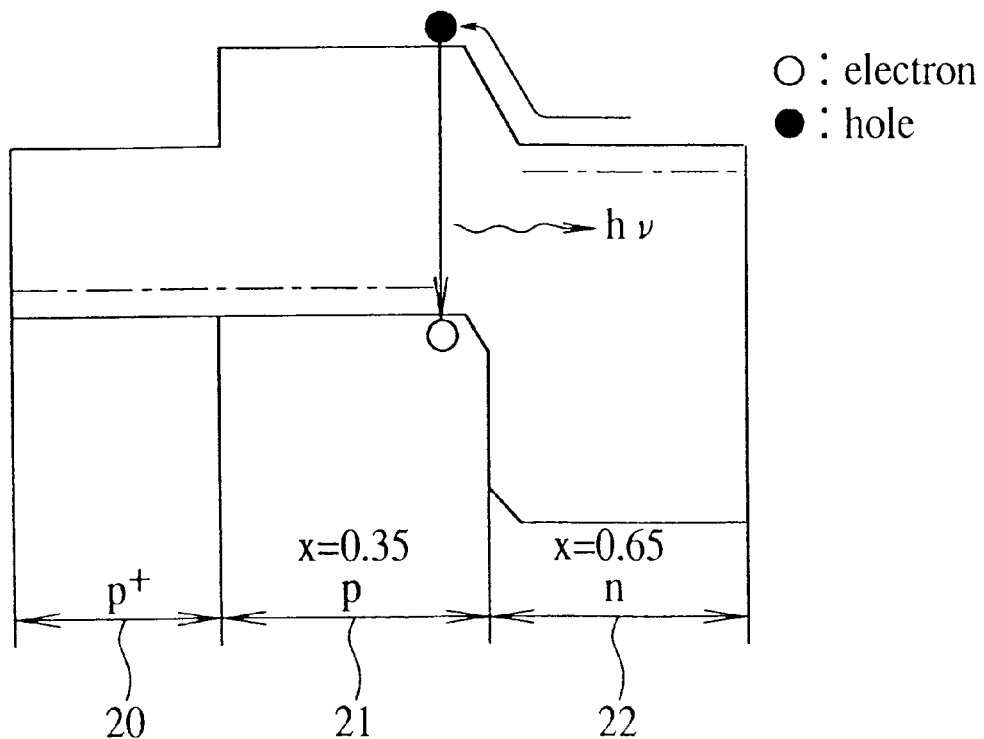

In the LED construction of FIG. 11, described above, injected electrons are contained or confined between the pn junction face and the interface between layers 104 and 802 by the barrier between layers 104 and 802, whereupon these electrons enhance light emission efficiency (FIG. 12(A) and 12(B)).

FIG. 13(A) and 13(B) are a plan and a cross-sectional view, respectively, of an LED array comprising the device of this embodiment and device separation regions. FIG. 13(B) represents a cutaway in the cross-sectional view of a section cut in the C—C plane of FIG. 13(A). In the LED array comprising devices of this embodiment, as illustrated in FIG. 13(B), device isolation or separation regions 903 are provided which extend from the outermost GaAs layer 406, that is either semi-insulating or undoped, at least to the p-type $Al_zGa_{1-z}As$ layer 902. An underlayer 408 comprises a substrate 401 and buffer layer 402.

By providing a p-type epitaxial layer 902 between the semi-insulating or undoped GaAs layer 402 and n-type epitaxial layer 404, it is possible to separate the n-type epitaxial layer into blocks containing suitable numbers of pn junctions by the device separation regions that reach the p-type epitaxial layer. Accordingly, an LED array can be fabricated which can be matrix-driven.

The p-type $Al_zGa_{1-z}As$ layer 902 may also be made an undoped $Al_zGa_{1-z}As$ layer. An $Al_zGa_{1-z}As$ layer formed by the MOCVD method, for example, when the aluminum content is high, becomes a p-type layer, so the effectiveness is the same as when it is made the p-type as noted above. With other materials, in cases of a semiconductor material wherewith a semi-insulating semiconductor layer is obtained by non-doping, the morphology and the device structure will be the same as in the second embodiment described earlier.

The LED of the third embodiment, as described in the foregoing, is formed as a laminated or stacked structure having, on a semi-insulating or undoped GaAs substrate 301, a semi-insulating or undoped GaAs buffer layer 302, $Al_zGa_{1-z}As$ layer 801, n-type $Al_yGa_{1-y}As$ layer 104, n-type $Al_xGa_{1-x}As$ layer 802, and semi-insulating or undoped GaAs layer 106. It also comprises a zinc diffusion region formed by the selective diffusion of zinc from the surface of the laminated structure. The diffusion front in the depth dimension in this diffusion region exists in the $Al_yGa_{1-y}As$ layer 104. The structure is such that the $Al_zGa_{1-z}As$ layer 801 or 902 is made either p-type or undoped, so the n-type epitaxial layer can be separated into blocks containing a suitable number of pn junctions by the device separation regions 903 that extend to the p-type epitaxial layer. This affords the benefit of being able to fabricate an LED array of high light emission efficiency which can be matrix-driven.

For this third embodiment, an example has been described wherein a semi-insulating or undoped GaAs substrate is used, but it is also possible to use a high-resistance Si substrate, as in the second embodiment. An n-type GaAs and a p-type GaAs substrate can be also used instead of a semi-insulating or undoped GaAs substrate, so the n-type epitaxial layer can be separated into blocks by the device separation regions 903 that extend to the p-type epitaxial layer.

In the embodiments described in the foregoing, examples are described of semiconductor device arrays which are LED array applications using $Al_xGa_{1-x}As$. Needless to say, however, applications are possible in any kind of semiconductor device so long as it be a light emitting device array fabricated by selectively diffusing an impurity of a second conductivity type at least in two epitaxial layers having a different energy band gap from a first conductivity type.

The semi-insulating device arrays to which the foregoing embodiments pertain may, furthermore, have any construction whatever, so long as it embodies one of the structures described, and the manufacturing process therefor, type of substrate therein, number of arrays, or positional arrangement, etc., are not limited to or by these embodiments.

In the embodiments described in the foregoing, the terms "undoped" and "semi-insulating" are employed. By "undoped" is meant that there is no doping with an impurity, while by "semi-insulating" is signified a semi-insulating property (resistivity≧approximately $10^7$ Ω·cm) irrespective of whether undoped or doped. The undoped GaAs substrates (also called wafers) ordinarily available exhibit a semi-insulating property (resistivity≧approximately $10^7$ Ω·cm).

What is claimed is:

1. A light emitting semiconductor device comprising a substrate having formed thereon a stacked structure comprising:

a semiconductor layer having an energy band gap; and a first conductivity type semiconductor layer, formed beneath said semiconductor layer and having a relatively smaller energy band gap than that of said semiconductor layer;

a pn junction face formed selectively in said first conductivity type semiconductor layer; and at least one semi-insulating or undoped semiconductor layer formed in said stacked structure, said stacked structure including said first conductivity type semiconductor layer.

2. The light emitting semiconductor device according to claim 1, wherein said first conductivity type semiconductor layer is an n-type semiconductor layer into which an impurity that determines a second conductivity type is diffused to form said pn junction therein.

3. The light emitting semiconductor device according to claim 2, wherein said impurity is zinc.

4. The light emitting semiconductor device according to claim 1, wherein said semiconductor layer, said first conductivity type semiconductor layer, and said at least one semi-insulating or undoped semiconductor layer are epitaxial compound semiconductor layers.

5. The light emitting semiconductor device according to claim 1, wherein said first conductivity type semiconductor layer is an $Al_yGa_{1-y}As$ layer ($1>y\geq 0$).

6. A light emitting semiconductor device according to claim 1, wherein said light emitting semiconductor device further comprises another semiconductor layer between said substrate and said first conductivity type semiconductor, said another semiconductor layer having an energy band gap larger than or equal to that of said first conductivity type semiconductor layer.

7. The light emitting semiconductor device according to claim 1, wherein a substrate for formation of said semiconductor stacked structure is either a GaAs substrate or an Si substrate.

8. A light emitting semiconductor device array wherein multiple light emitting semiconductor devices are positioned in a prescribed alignment; and said light emitting semiconductor devices are the light emitting semiconductor device cited in claim 1.

9. A light emitting semiconductor device comprising:

a stacked structure provided with semiconductor layers having energy band gaps formed on and beneath a first conductivity type semiconductor layer having a relatively smaller energy band gap than those of said semiconductor layers; and an outermost semiconductor layer provided on the upper side of said stacked structure;

a second conductivity type impurity diffusion region is formed which extends from upper surface of said outermost semiconductor layer into said first conductivity type semiconductor layer; and said outermost semiconductor layer is an undoped or semi-insulating semiconductor layer wherewith ohmic contact is formed by said impurity diffusion region and an electrode.

10. The light emitting semiconductor device according to claim 9, wherein said semiconductor layers are same conductivity type semiconductor layers as that of said first conductivity type semiconductor layer.

11. The light emitting semiconductor device according to claim 9, wherein said semiconductor layer formed on said first conductivity type semiconductor layer is first conductivity type; and said semiconductor layer formed beneath said first conductivity type semiconductor layer is either an undoped semiconductor layer, semi-insulating semiconductor layer, or second conductivity type semiconductor layer.

12. A light emitting semiconductor device array wherein multiple light emitting semiconductor devices are positioned in a prescribed alignment; and said light emitting semiconductor devices are the light emitting semiconductor device cited in claim 9.

13. A light emitting semiconductor device comprising:
an underlayer;
a stacked body in which are stacked, in order, on an upper surface of said underlayer, a first semiconductor layer having energy band gap Eg1, a first conductivity type second semiconductor layer having energy band gap Eg2, and a third semiconductor layer having energy band gap Eg3;

a semi-insulating or undoped fourth semiconductor layer formed on or above said stacked body;

a second conductivity type diffusion region formed as a partial region extending from upper surface of said fourth semiconductor layer into said second semiconductor layer; and first and second electrodes for injecting carriers into said diffusion layer and said second semiconductor layer; wherein:

said first, second, third, and fourth semiconductor layers, respectively, consist of a compound semiconductor;

said Eg1, Eg2, and Eg3 sustain relationships Eg1>Eg2 and Eg3>Eg2; and a diffusion front of said diffusion region is a pn junction face.

14. The light emitting semiconductor device according to claim 13, wherein first conductivity type is made n conductivity type, and second conductivity type is made p conductivity type.

15. The light emitting semiconductor device according to claim 14, wherein Zn (zinc) is dopant in said diffusion region.

16. The light emitting semiconductor device according to claim 14, wherein said first electrode is provided as an n-type electrode at lower surface of said underlayer; and said second electrode is electrically connected as a p-type electrode to said diffusion region.

17. The light emitting semiconductor device according to claim 14, wherein said first electrode makes ohmic contact with said second semiconductor layer.

18. The light emitting semiconductor device according to claim 13, wherein said stacked body comprises an energy band gap structure wherein holes constituting said carriers are contained or confined between said pn junction face and a first interface between said second and first semiconductor layers, and electrons constituting said carriers are contained or confined between said pn junction face and a second interface between said second and third semiconductor layers.

19. The light emitting semiconductor device according to claim 13, wherein said first semiconductor layer is made an $Al_zGa_{1-z}As$ layer; said second semiconductor layer is made an $Al_yGa_{1-y}As$ layer; and said third semiconductor layer is made an $Al_xGa_{1-x}As$ layer; wherein also $1\geq x>y\geq 0$ and $1\geq z>y\geq 0$.

20. The light emitting semiconductor device according to claim 19, wherein said fourth semiconductor layer comprises GaAs.

21. The light emitting semiconductor device according to claim 19, wherein said underlayer comprises an n-type substrate and an n-type buffer layer; said substrate comprises GaAs or Si; and said buffer layer comprises GaAs.

22. The light emitting semiconductor device according to claim 19, wherein said underlayer comprises a semi-insulating or undoped GaAs substrate and a semi-insulating or undoped GaAs buffer layer.

23. The light emitting semiconductor device according to claim 19, wherein said first, second, and third semiconductor layers are made n-type layers.

24. The light emitting semiconductor device according to claim 13, wherein said diffusion region and said second electrode make ohmic contact.

25. The light emitting semiconductor device according to claim 13, wherein said first semiconductor layer is made an n-type; said second semiconductor layer is made an n-type; and said third semiconductor layer is made either an n-type or semi-insulating.

26. The light emitting semiconductor device according to claim 13, wherein said second semiconductor layer is made second conductivity type.

27. The light emitting semiconductor device according to claim 26, wherein said underlayer comprises a high-resistance Si substrate and a semi-insulating or undoped GaAs buffer layer.

28. The light emitting semiconductor device according to claim 13, wherein said first semiconductor layer is made a semi-insulating or undoped layer.

29. A light emitting semiconductor device array formed by alignment of light emitting semiconductor devices that are the light emitting semiconductor device cited in claim 13.

30. A light emitting semiconductor device comprising:

an underlayer;

a stacked body in which are stacked, in order, on an upper surface of said underlayer, a first semiconductor layer having energy band gap Eg1, a first conductivity type second semiconductor layer having energy band gap Eg2, and a third semiconductor layer having energy band gap Eg3;

a semi-insulating or undoped fourth semiconductor layer formed on or above said stacked body;

a second conductivity type diffusion region formed as a partial region extending from upper surface of said fourth semiconductor layer into said second semiconductor layer; and first and second electrodes for injecting carriers into said diffusion layer and said second semiconductor layer;

wherein:

said first, second, third, and fourth semiconductor layers, respectively, comprise a compound semiconductor;

said Eg1, Eg2, and Eg3 sustain relationships Eg1=Eg2 and Eg3>Eg2; and diffusion front of said diffusion region is a pn junction face.

31. A light emitting semiconductor device according to claim 30, wherein said first semiconductor layer is made an $Al_zGa_{1-z}As$ layer; said second semiconductor layer is made an $Al_yGa_{1-y}As$ layer; and said third semiconductor layer is made an $Al_xGa_{1-x}As$ layer; wherein also $1 \geq x > y \geq 0$, $z=y$ and $1 \geq z(=y) \geq 0$.

32. A light emitting semiconductor device array formed by alignment of light emitting semiconductor devices that are the light emitting semiconductor device cited in claim 30.

* * * * *